United States Patent
Park et al.

(10) Patent No.: US 9,490,696 B2
(45) Date of Patent: Nov. 8, 2016

(54) CHARGE PUMP WITH SWITCHING GATE BIAS

(71) Applicant: QUALCOMM Incorporated, San Diego, CA (US)

(72) Inventors: Dongmin Park, San Diego, CA (US); Lai Kan Leung, San Marcos, CA (US); Jong Min Park, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/617,025

(22) Filed: Feb. 9, 2015

(65) Prior Publication Data

US 2016/0233763 A1 Aug. 11, 2016

(51) Int. Cl.
*H02M 3/07* (2006.01)
*H03L 7/093* (2006.01)
*H03L 7/099* (2006.01)

(52) U.S. Cl.
CPC ............... *H02M 3/07* (2013.01); *H03L 7/093* (2013.01); *H03L 7/099* (2013.01)

(58) Field of Classification Search
CPC ............ H03K 19/018521; H03K 19/018528; H03K 17/691; H03K 17/687; H03K 3/012; H03K 4/06; H03K 4/50; H03K 5/01; H03L 7/093; H03L 7/099; H03L 7/085
USPC ....... 327/147, 148, 149, 156, 158, 161, 534, 327/536
See application file for complete search history.

(56) References Cited

U.S. PATENT DOCUMENTS

| | | |
|---|---|---|
| 5,164,889 A | 11/1992 | Ruetz |
| 5,473,283 A | 12/1995 | Luich |
| 6,160,432 A | 12/2000 | Rhee et al. |
| 6,255,872 B1 * | 7/2001 | Harada ................. H03L 7/0896 327/148 |
| 7,969,247 B2 | 6/2011 | Yang et al. |
| 8,018,269 B2 | 9/2011 | Wang et al. |
| 8,330,511 B2 * | 12/2012 | Raghunathan ........ H03L 7/0896 327/149 |

FOREIGN PATENT DOCUMENTS

| | | |
|---|---|---|
| EP | 0945986 A2 | 9/1999 |
| EP | 1107457 A2 | 6/2001 |

OTHER PUBLICATIONS

Hati M.K., et al., "A High O/P Resistance, Wide Swing and Perfect Current Matching Charge Pump Having Switching Circuit for PLL," Microelectronics Journal, 2013, vol. 44, pp. 649-657.
International Search Report and Written Opinion—PCT/US2016/013025—ISA/EPO—Mar. 23, 2016.

* cited by examiner

*Primary Examiner* — John Poos
(74) *Attorney, Agent, or Firm* — Procopio, Cory, Hargreaves & Savitch LLP (57) ABSTRACT

An apparatus including: a current source configured to generate current; a bias node coupled to the current source; a switching current source circuit coupled to the current source and the bias node to allow the current to flow through the switching current source circuit into the bias node; a biasing circuit configured to receive a control signal from a phase detector, and mirror the current flowing through the switching current source circuit in response to the control signal; and a switch device disposed between the switching current source circuit and the biasing circuit to isolate the switching current source circuit from the biasing circuit.

17 Claims, 5 Drawing Sheets

CHARGE PUMP WITH SWITCHING GATE BIAS

BACKGROUND

1. Field

This invention relates generally to a charge pump, and more specifically, to a switching gate bias circuit in the charge pump.

2. Background

A phase-locked loop (PLL) is a control system that generates an output signal whose phase is related to the phase of an input signal. The PLL is widely used in radio, telecommunications, computers and other electronic applications. They can be used to demodulate a signal, recover a signal from a noisy communication channel, generate a stable frequency at multiples of an input frequency, or distribute precisely timed clock pulses in digital logic circuits such as microprocessors.

The PLL may include a phase detector, a charge pump, a loop filter, a voltage-controlled oscillator (VCO), and a frequency divider. The VCO generates an output signal. The phase detector receives an input signal compares the phase of the VCO-generated output signal with the phase of the input signal and adjusts the VCO to keep the phases matched. The output of the phase detector also acts as a current source to pump current into and out of the loop filter using the charge pump by turning the charge pump on and off periodically. However, when drain and source terminals of mirror transistors in the charge pump are switched, the voltage at the gate terminal (bias node) of the mirror transistors is also disturbed which degrades the transient behavior and linearity of the charge pump. When the charge-pump is nonlinear, noise of the delta sigma ($\Delta\Sigma$) modulator (DSM) is folded in and the in-band noise is degraded in the PLL. One solution is to add an RC filter between the mirror transistors. However, this solution can significantly increase the area on a chip.

SUMMARY

The present disclosure provides for isolating a switching current source circuit and a biasing circuit in a charge pump of a phase locked loop (PLL) by adding a switch between the two circuits so that the biasing circuit is not affected by the switching activities of the switching current source circuit and substantially reduces the transient settling within the charge pump.

In one embodiment, an apparatus is disclosed. The apparatus includes: a current source configured to generate current; a bias node coupled to the current source; a switching current source circuit coupled to the current source and the bias node to allow the current to flow through the switching current source circuit into the bias node; a biasing circuit configured to receive a control signal from a phase detector, and mirror the current flowing through the switching current source circuit in response to the control signal; and a switch device disposed between the switching current source circuit and the biasing circuit to isolate the switching current source circuit from the biasing circuit.

In another embodiment, a charge pump is disclosed. The charge pump includes: a biasing circuit configured to receive a control signal from a phase detector and output a current pulse train signal to an output node; a switching current source circuit configured to enable current to flow through and into a bias node and to mirror the current onto the biasing circuit; and a switch device disposed between the biasing circuit and the switching current source circuit, wherein the switch device isolates the two circuits so that the bias node and the biasing circuit are not affected by switching activities of the switching current source circuit.

In another embodiment, a phase-locked loop is disclosed. phase-locked loop includes: a phase detector configured to receive a reference signal and a divider output signal and output a control signal and a complementary control signal; a charge pump including: a biasing circuit configured to receive the control signal from the phase detector and output a current pulse train signal to an output node; a switching current source circuit configured to enable current to flow through and into a bias node and to mirror the current onto the biasing circuit; and a switch device disposed between the biasing circuit and the switching current source circuit, wherein the switch device isolates the two circuits so that the bias node and the biasing circuit are not affected by switching activities of the switching current source circuit; a low pass filter configured to receive the current pulse train signal and output a control voltage; a voltage controlled oscillator configured to receive the control voltage and output a corresponding frequency signal; and a frequency divider configured receive the corresponding frequency signal and output the divider output signal for feedback to the phase detector.

Other features and advantages of the present disclosure should be apparent from the present description which illustrates, by way of example, aspects of the disclosure.

BRIEF DESCRIPTION OF THE DRAWINGS

The details of the present disclosure, both as to its structure and operation, may be gleaned in part by study of the appended further drawings, in which like reference numerals refer to like parts, and in which.

DETAILED DESCRIPTION

Certain embodiments as described herein provide for isolating the switching current source circuit and the biasing circuit in a charge pump of a phase locked loop (PLL) by adding a switch between the two circuits so that the biasing circuit is not affected by the switching activity and substantially reduces the transient settling within the charge pump. The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Figure 1A:
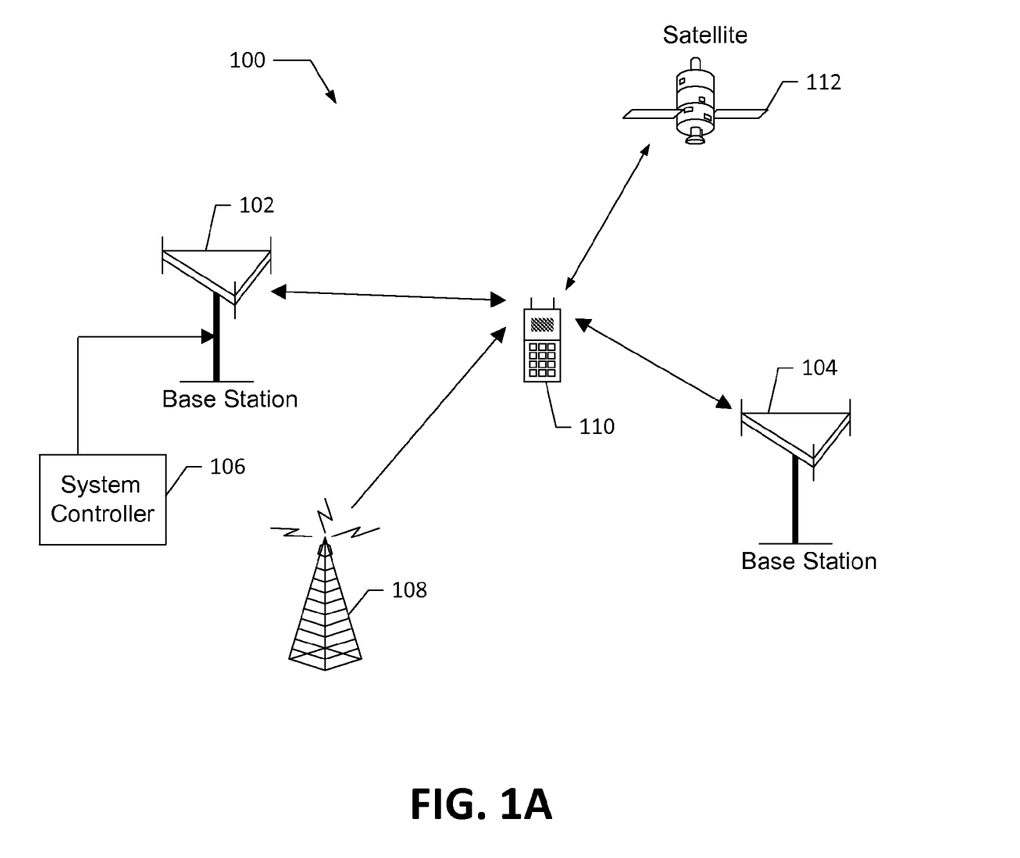
FIG. 1A is a block diagram of an exemplary wireless device communicating with a wireless communication system.

FIG. 1A is an exemplary wireless device 110 communicating with a wireless communication system 100. The wireless system 100 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1×, Evolution-Data Optimized (EVDO), Time Division Synchronous CDMA (TD-SCDMA), or some other version of CDMA. For simplicity, FIG. 1A shows wireless system 100 including two base stations 102 and 104 and one system controller 106. In general, a wireless system may include any number of base stations and any set of network entities.

The wireless device 110 may also be referred to as a user equipment (UE), a mobile station, a terminal, an access terminal, a subscriber unit, a station, etc. The wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. The wireless device 110 may communicate with a wireless system 100. The wireless device 110 may also receive signals from broadcast stations (e.g., a broadcast station 108), signals from satellites (e.g., a satellite 112) in one or more global navigation satellite systems (GNSS), etc. The wireless device 110 may support one or more radio technologies for wireless communication such as LTE, WCDMA, CDMA 1×, EVDO, TD-SCDMA, GSM, 802.11, etc.

Figure 1B:
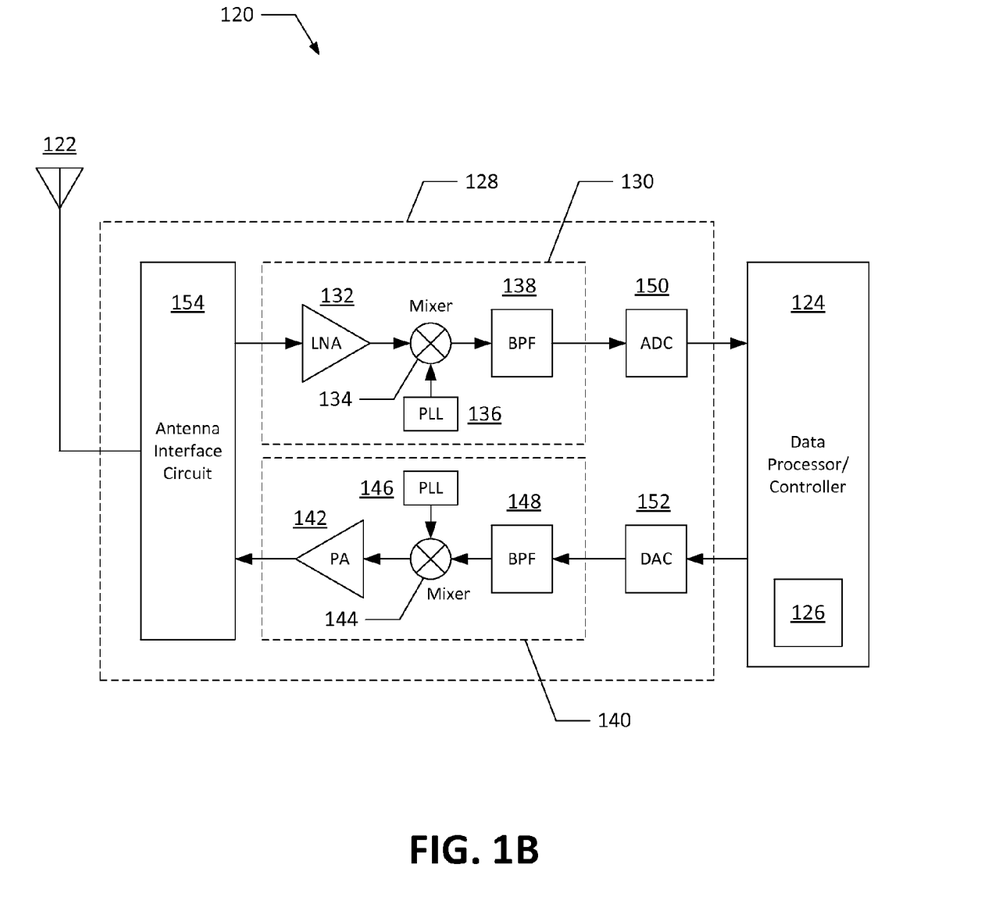
FIG. 1B is a block diagram of an exemplary design of a wireless device that is one embodiment of the wireless device shown in FIG. 1A.

FIG. 1B is a block diagram of an exemplary design of a wireless device 120 that is one embodiment of a wireless device 110 of FIG. 1A. In this exemplary design, the wireless device 120 includes a transceiver 128 coupled to an antenna 122, and a data processor/controller 124. The transceiver 128 includes antenna interface circuit 154, a receiver path 130, and a transmitter path 140. Antenna interface circuit 154 may include switches, duplexers, transmit filters, receive filters, matching circuits, etc. The data processor/controller 124 may perform various functions for the wireless device 120. For example, the data processor 124 may perform processing for data being received via the receiver path 130 and data being transmitted via the transmitter path 140. The controller 124 may control the operation of various circuits within the transceiver 128. Memory 126 may store program codes and data for the data processor/controller 124. The data processor/controller 124 may be implemented on one or more application specific integrated circuits (ASICs) and/or other ICs. The receiver path 130 includes a low noise amplifier (LNA) 132, a mixer 134, a phase locked loop (PLL) 136, and a bandpass filter 138. An analog-to-digital converter (ADC) 150 is placed subsequent to the bandpass filter 138 to digitize the baseband signal. The transmitter path 140 includes a bandpass filter 148, a PLL 146, a mixer 144, and a power amplifier (PA) 142. A digital-to-analog converter (DAC) 152 is placed between the data processor/controller 124 and the bandpass filter 148 to convert the digital data to the analog baseband signal. In the illustrated embodiment of FIG. 1B, the receiver path 130 includes PLL 136 and the transmitter path 140 includes PLL 146 to provide local oscillator signals to the mixer 134, 144. However, in other embodiments, both receiver path 130 and transmitter path 140 can use a single common PLL.

For data reception, antenna 122 receives signals from base stations and/or other transmitter stations and provides a received RF signal, which is routed through an antenna interface circuit 154 and presented as an input RF signal to the receiver path 130. Within the receiver path 130, the LNA 132 amplifies the input RF signal and provides an output RF signal to the mixer 134. The PLL 136 generates a local oscillator signal. The mixer 134 mixes the output RF signal with the PLL-generated local oscillator signal to downconvert the output RF signal from RF to baseband. The bandpass filter 138 filters the downconverted signal to provide an analog input signal to the ADC 150, which converts the analog input signal to the digital data and provides the digital data to the data processor/controller 124. The receiver path 130 may include other elements such as matching circuits, an oscillator, etc.

For data transmission, the data processor/controller 124 processes (e.g., encodes and modulates) data to be transmitted and provides a digital data to the DAC 152, which converts the digital data to an analog output signal and provides the converted analog output signal to the transmitter path 140. Within the transmitter path 140, the bandpass filter 148 amplifies and filters the analog output signal. The PLL 146 generates a local oscillator signal. The mixer 144 mixes the filtered analog output signal with the PLL-generated local oscillator signal to upconvert the filtered analog output signal from baseband to RF and provide a modulated RF signal. The transmitter path 140 may include other elements such as matching circuits, an oscillator, etc. The PA 142 receives and amplifies the modulated RF signal and provides a transmit RF signal having the proper output power level. The transmit RF signal is routed through antenna interface circuit 154 and transmitted via antenna 122.

Figure 1C:
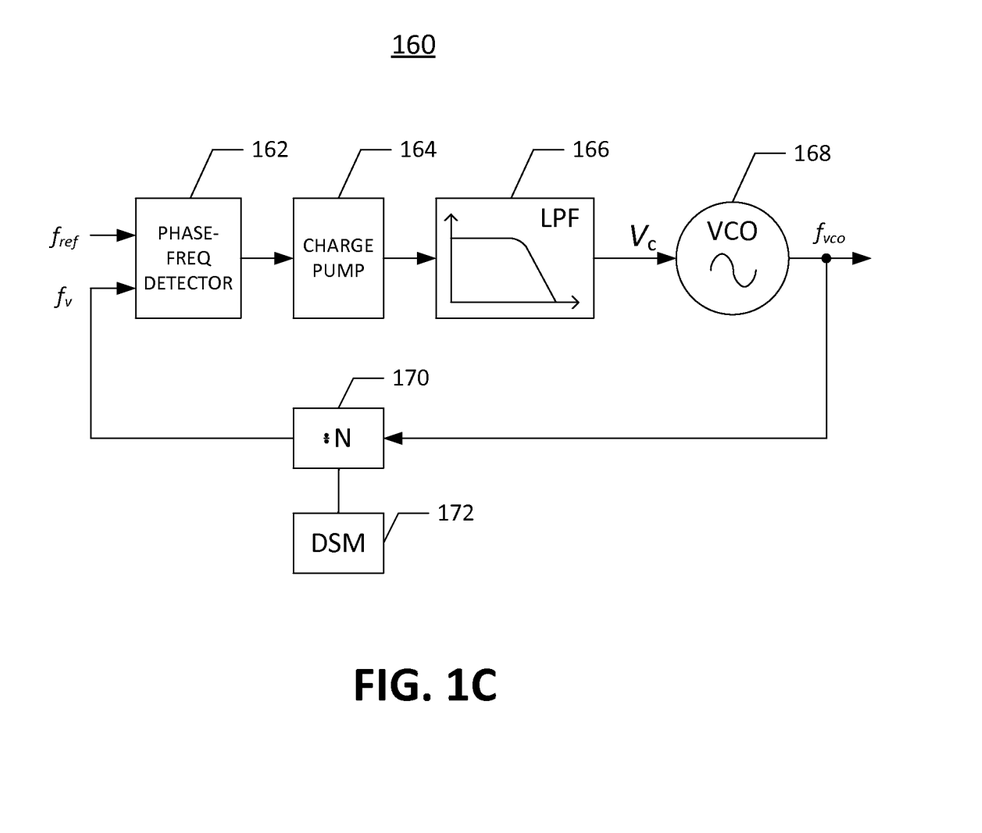
FIG. 1C is a block diagram of a phase-locked loop (PLL) that is one embodiment of a PLL in FIG. 1B.

FIG. 1C is a block diagram of a phase-locked loop (PLL) 160 that is one embodiment of PLL 136 or 146 of FIG. 1B. In the illustrated embodiment of FIG. 1C, the PLL 160 includes a phase detector 162, a charge pump 164, a loop filter 166, a VCO 168, a frequency divider 170, and a delta sigma modulator (DSM) 172. The VCO 168 generates an output signal. The phase detector 162 receives a reference clock signal ($f_{ref}$) at its first input lead from a source such as a crystal oscillator. The phase detector 162 also receives the divider output signal ($f_v$) at its second input lead. Using these signals, the phase detector 162 compares and adjusts the VCO 168 to keep the phases matched. The phase detector 162 further generates an up charge pump control signal (UP) and a down charge pump control signal (DN). The UP and DN signals are supplied to the charge pump 164. Thus, the output of the phase detector 162 controls the charge pump 164 to acts as a current source to pump current into and out of the loop filter 166 by turning the charge pump on and off periodically. The frequency divider 170 divides the single-bit VCO output signal ($f_{vco}$) by a multi-bit digital divisor value generated by the DSM 172, and outputs the resulting divided-down single-bit feedback signal ($f_v$) to the second input lead of the phase detector 162.

Figure 2:
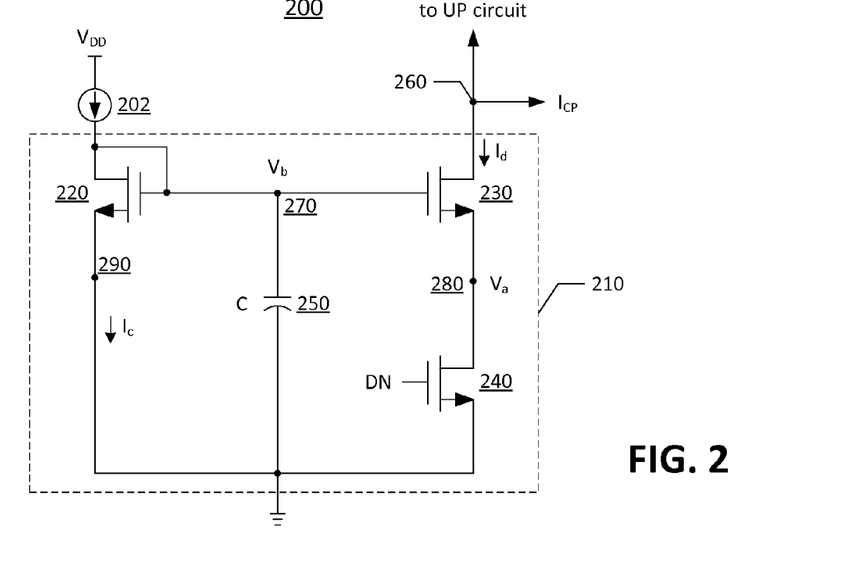
FIG. 2 is a schematic diagram of a portion of a charge pump (which is one embodiment of a charge pump shown in FIG. 1C) in further detail.

FIG. 2 is a schematic diagram of a portion of a charge pump 200 (which is one embodiment of a charge pump 164 shown in FIG. 1C) in further detail. The partial diagram of FIG. 2 shows a down (DN) current source 202 and a down (DN) current mirror circuit 210. Not shown are up current source and up current mirror circuit, which can be configured similarly to the DN current source 202 and the DN current mirror circuit 210, respectively. The charge pump 200 outputs a current pulse train signal ($I_{CP}$) at the output node 260.

The DN current mirror circuit 210 includes a first mirror transistor 220, a second mirror transistor 230, a switch transistor 240, and a capacitor 250. The first and second mirror transistors 220, 230 (which form a current mirror) are configured as n-channel transistors, but can be configured as p-channel transistors as well. Gate terminals of the first and second mirror transistors 220, 230 are coupled to a DN bias node 270. The gate terminal of the switch transistor 240 is controlled by the DN signal. When the switch transistor 240 is turned on, the current flowing from the supply node ($V_{DD}$), through the DN current source 202, and through the first mirror transistor 220, is mirrored onto the second mirror transistor 230. The DN current ($I_d$) flows from output node 260 of the charge pump 200 through the second mirror transistor 230, node 280, and the switch transistor 240 to the ground node.

In operation, when the DN signal goes high, DN current $I_d$ flows through the transistors 230, 240. The magnitude of current $I_d$ is set by the current flowing through the DN current source 202. When the current is made to flow through the transistors 220, 230, 240 by switching the drain and source terminals of the mirror transistors 220, 230, there are perturbations on the DN bias node 270, and when the current is made to stop flowing through the transistors 220, 230, 240, there are other perturbations on the DN bias node 270. One example of a perturbation includes degradation of transient behavior and linearity of the charge pump 200.

Figure 3:
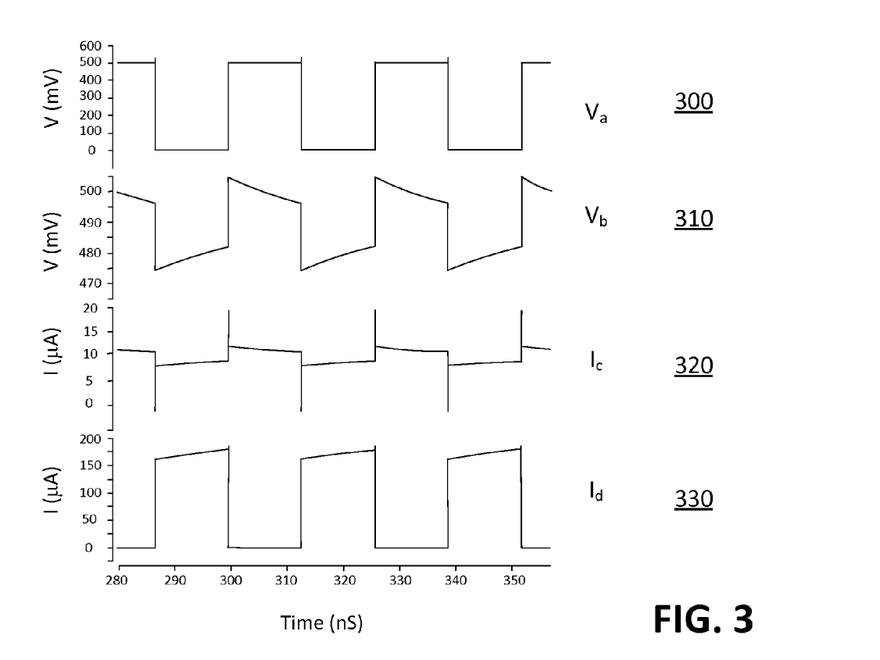
FIG. 3 shows timing diagrams voltages and currents at various nodes in FIG. 2.

FIG. 3 shows timing diagrams 300, 310 of voltages at nodes 280, 270, respectively, and timing diagrams 320, 330 of currents flowing out of nodes 290, 260, respectively. Timing diagram 300 illustrates voltage $V_a$ at node 280 which shows the turning on and off of the switch transistor 240 controlled by the DN signal. Timing diagram 310 illustrates voltage $V_b$ at bias node 270 in FIG. 2. However, timing diagram 310 shows the degradation of the transient behavior in voltage $V_b$ at bias node 270. Timing diagram 320 illustrates current $I_c$ flowing out of the current source 202 through the source terminal (node 290) of the first mirror transistor 220. Again, timing diagram 330 shows the degradation of the transient behavior and linearity in current $I_d$ flowing out of the output node 260.

Figure 4:
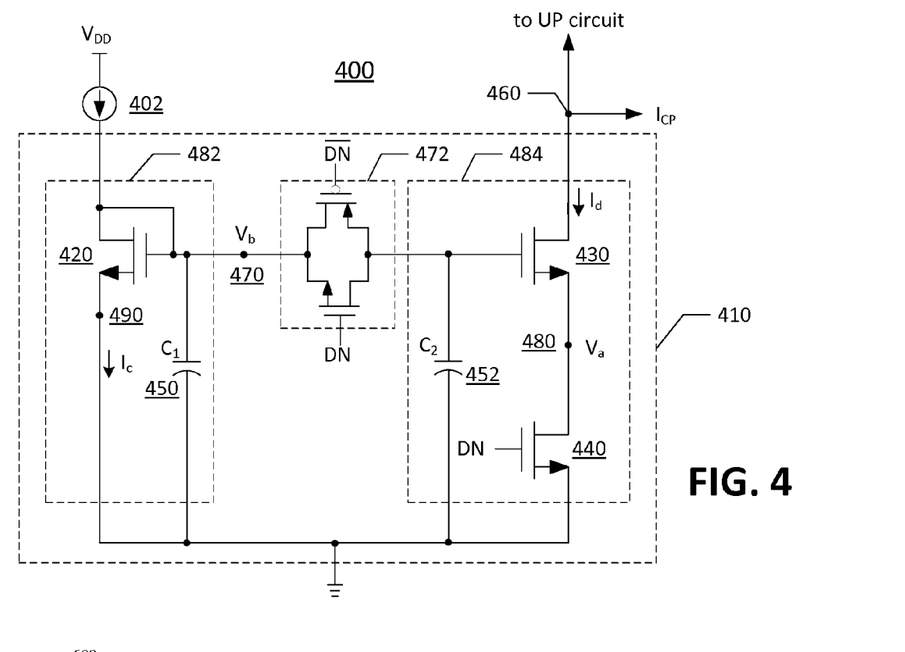
FIG. 4 is a schematic diagram of a portion of a charge pump (which is one embodiment of a charge pump shown in FIG. 1C) in accordance with one embodiment of the present disclosure.

FIG. 4 is a schematic diagram of a portion of a charge pump 400 (which is one embodiment of a charge pump 164 shown in FIG. 1C) in accordance with one embodiment of the present disclosure. The illustrated embodiment of FIG. 4 provides for isolating the switching current source circuit 482 and the biasing circuit 484. This is done by adding a switch device 472 between the two circuits 482, 484 so that the biasing circuit 484 is isolated from the switching current source circuit 482. In illustrated embodiment of FIG. 4, the switch device 472 includes a first terminal, a second terminal, and a pair of transistors (first and second transistors). Further, drain and source terminals of the first transistor are coupled to the first terminal and drain and source terminals of the second transistor are coupled to the second terminal. A gate terminal of the first transistor is configured to receive DN signal and a gate terminal of the second transistor is configured to receive DNB signal. In this configuration, the biasing circuit 484 is not affected by the switching activity of the switching current source circuit 482 and substantially reduces the transient settling.

The illustrated embodiment of FIG. 4 is "a portion" of the charge pump 400 because FIG. 4 only shows a down (DN) current source 402 and a down (DN) current mirror circuit 410. Not shown are up current source and up current mirror circuit, which can be configured similarly to the DN current source 402 and the DN current mirror circuit 410, respectively. The charge pump 400 outputs a current pulse train signal ($I_{CP}$) at the output node 460. As stated above, the charge pump 400 provides for isolating the switching current source circuit 482 from the biasing circuit 484 while the DNB signal is asserted. The isolation is accomplished by adding a switch device 472 between the two circuits 482, 484 so that the biasing circuit 484 is not affected by the switching activity of the switching current source circuit 482. That is, when the DNB signal is asserted (and the DN signal de-asserted), the switch device 472 is opened and the two circuits 482, 484 are isolated. In one embodiment, the switch device 472 is configured as a transmission switch having a pair of metal oxide semiconductor field-effect transistors (MOSFETs) controlled by DN and DNB signals. In other embodiments, the switch device 472 is configured with any electronic device that can isolate two circuits such as a single transistor or mechanical device.

The DN current mirror circuit 410 includes a first mirror transistor 420, a second mirror transistor 430, a switch transistor 440, a switch device 472, and a pair of capacitors 450, 452. The first and second mirror transistors 420, 430 (which form a current mirror) are configured as n-channel transistors, but can be configured as p-channel transistors as well. Gate terminals of the first and second mirror transistors 420, 430 are coupled to each other through a switch device 472, which couples to a DN bias node 470. Thus, the switch device 472, which is controlled by the DN/DNB signal, is disposed between the gate terminals of the first and second mirror transistors 420, 430 to isolate the two transistors while the DN signal is low. Capacitor 250 of FIG. 2 is split into a pair of capacitors 450, 452 (of same or similar size) and the switch device 472 is placed between the two capacitors 450, 452. The gate terminal of the switch transistor 440 is controlled by the DN signal. When the switch transistor 440 is turned on (with the DN signal set to high), the current flowing from the supply node ($V_{DD}$), through the DN current source 402, and through the first mirror transistor 420, is mirrored onto the second mirror transistor 430 because the switch device 472 is also turned on. The DN current ($I_d$) flows from charge pump output node 460 through the second mirror transistor 430, node 480, and the switch transistor 440 to the ground node. The magnitude of current $I_d$ is set by the current flowing through the DN current source 402. When the DN signal goes low, the switch device 472 turns off to isolate the switching current source circuit 482 from the bias circuit 484 so that the switching of the transistors does not cause perturbations on the bias node 470.

It should be noted that the embodiment of FIG. 4, which includes an isolation switch inserted between the switching current source circuit and the biasing circuit, is configured for the DN circuitry in a charge pump. Accordingly, a similar configuration of inserting an isolation switch between the switching current source circuit and the biasing circuit can be made in the UP circuitry of a charge pump.

Figure 5:
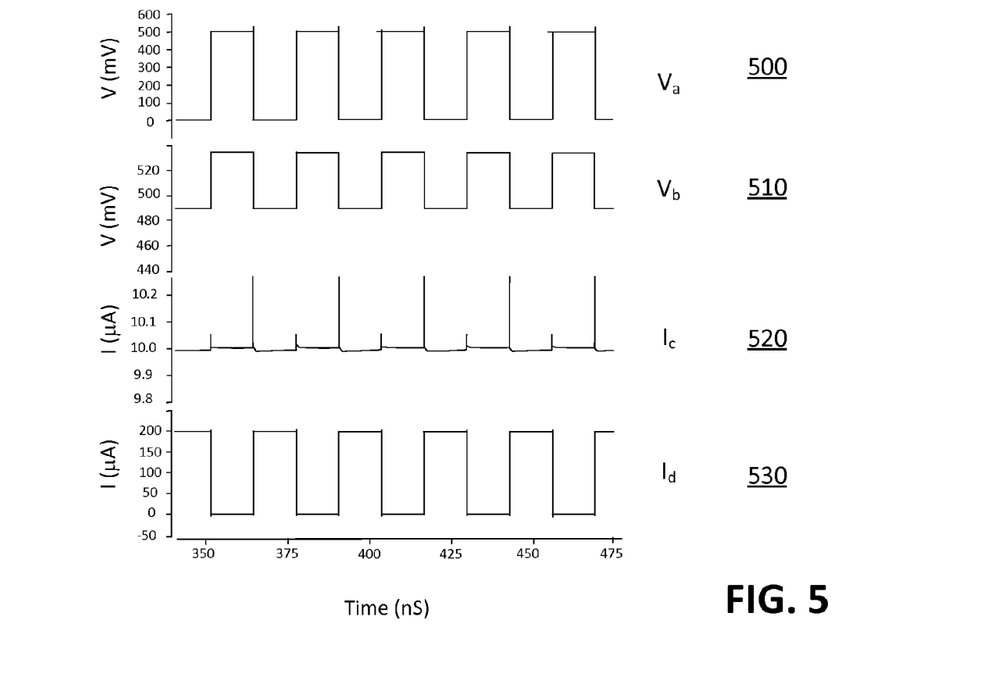
FIG. 5 shows timing diagrams of voltages and currents at various nodes in FIG. 4.

FIG. 5 shows timing diagrams 500, 510 of voltages at nodes 480, 470, respectively, and timing diagrams 520, 530 of currents flowing out of nodes 490, 460, respectively.

Timing diagram 500 illustrates voltage $V_a$ at node 480 which shows the turning on and off of the switch transistor 440 controlled by the DN signal. Timing diagram 510 illustrates voltage $V_b$ at bias node 470. However, with switch device 472 isolating the two circuits 482, 484, timing diagram 510 shows no degradation of the transient behavior in voltage $V_b$ at bias node 470. Thus, timing diagram 510 shows that the insertion of the isolation switch device 472 in the charge pump 400 provides advantages over other charge pumps with no isolation between the two circuits 484, 484. Timing diagram 420 illustrates current $I_c$ flowing out of the current source 402 through the source terminal (node 490) of the first mirror transistor 420. Timing diagram 530 illustrates current $I_d$ flowing out of the output node 460. Timing diagram 530 clearly shows the improvement in the transient behavior and linearity of current $I_d$ flowing out of the output node 460.

Although several embodiments of the present disclosure are described above, many variations of the disclosure are possible. For example, although the illustrated embodiments described above configure the charge pump with transistors and capacitors, other elements such as buffers, operational amplifiers, and switches can be used to configure the charge pump. Further, features of the various embodiments may be combined in combinations that differ from those described above. Moreover, for clear and brief description, many descriptions of the systems and methods have been simplified. Many descriptions use terminology and structures of specific standards. However, the disclosed systems and methods are more broadly applicable.

Those of skill will appreciate that the various illustrative blocks and modules described in connection with the embodiments disclosed herein can be implemented in various forms. Some blocks and modules have been described above generally in terms of their functionality. How such functionality is implemented depends upon the design constraints imposed on an overall system. Skilled persons can implement the described functionality in varying ways for each particular application, but such implementation decisions should not be interpreted as causing a departure from the scope of the disclosure. In addition, the grouping of functions within a module, block, or step is for ease of description. Specific functions or steps can be moved from one module or block without departing from the disclosure.

The various illustrative logical blocks, units, steps, components, and modules described in connection with the embodiments disclosed herein can be implemented or performed with a processor, such as a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor can be a microprocessor, but in the alternative, the processor can be any processor, controller, microcontroller, or state machine. A processor can also be implemented as a combination of computing devices, for example, a combination of a DSP and a microprocessor, a plurality of microprocessors, one or more microprocessors in conjunction with a DSP core, or any other such configuration. Further, circuits implementing the embodiments and functional blocks and modules described herein can be realized using various transistor types, logic families, and design methodologies.

The above description of the disclosed embodiments is provided to enable any person skilled in the art to make or use the disclosure. Various modifications to these embodiments will be readily apparent to those skilled in the art, and the generic principles described herein can be applied to other embodiments without departing from the spirit or scope of the disclosure. Thus, it is to be understood that the description and drawings presented herein represent presently preferred embodiments of the disclosure and are therefore representative of the subject matter which is broadly contemplated by the present disclosure. It is further understood that the scope of the present disclosure fully encompasses other embodiments that may become obvious to those skilled in the art and that the scope of the present disclosure is accordingly limited by nothing other than the appended claims.

The invention claimed is:

1. An apparatus comprising:
a current source configured to generate current;
a bias node coupled to the current source;
a switching current source circuit coupled to the current source and the bias node to allow the current to flow through the switching current source circuit into the bias node;
a biasing circuit configured to receive a control signal from a phase detector, and mirror the current flowing through the switching current source circuit in response to the control signal,
wherein the biasing circuit comprises a second transistor having gate, source, and drain terminals, a third transistor having gate, source, and drain terminals, and a second capacitor,
wherein the gate terminal of the third transistor receives the control signal, the drain terminal of the third transistor is coupled to the source terminal of the second transistor, and the source terminal of the third transistor is coupled to a ground voltage;
a switch device disposed between the switching current source circuit and the biasing circuit to isolate the switching current source circuit from the biasing circuit,
wherein the gate terminal of the second transistor is coupled to the switch device; and
an output node coupled to the drain terminal of the second transistor.

2. The apparatus of claim 1, wherein the apparatus is a charge pump of a phase-locked loop.

3. The apparatus of claim 1, wherein the switch device is configured to receive the control signal.

4. The apparatus of claim 3, wherein the control signal activates the switch device.

5. The apparatus of claim 1, wherein the switch device comprises a first terminal, a second terminal, and a pair of fourth and fifth transistors.

6. The apparatus of claim 5, wherein drain and source terminals of the fourth and fifth transistors, respectively, are coupled to the first terminal and drain and source terminals of the fifth and fourth transistors, respectively, are coupled to the second terminal.

7. The apparatus of claim 6, wherein a gate terminal of the fifth transistor is configured to receive the control signal and a gate terminal of the fourth transistor is configured to receive a complementary control signal.

8. The apparatus of claim 1, wherein the switching current source circuit comprises a first transistor configured with a gate terminal coupled to the bias node, a drain terminal coupled to the current source and the gate terminal, and a source terminal coupled to the ground voltage.

9. The apparatus of claim 8, further comprising a first capacitor coupled to the gate terminal of the first transistor and the ground voltage.

10. The apparatus of claim 9, wherein the switch device comprises first and second terminals, the first terminal coupled to the gate terminal of the first transistor.

11. A charge pump, comprising:
a biasing circuit configured to receive a control signal from a phase detector and output a current pulse train signal to an output node,
wherein the biasing circuit comprises a third transistor having gate, source, and drain terminals, a fourth transistor having gate, source, and drain terminals, and a first capacitor,
wherein the gate terminal of the fourth transistor receives the control signal, the drain terminal of the fourth transistor is coupled to the source terminal of the third transistor, the source terminal of the fourth transistor is coupled to a ground voltage, and the drain terminal of the third transistor is coupled to the output node;
a switching current source circuit configured to enable current to flow through and into a bias node and to mirror the current onto the biasing circuit; and
a switch device disposed between the biasing circuit and the switching current source circuit,
wherein the switch device isolates the biasing circuit and the switching current source circuit so that the bias node and the biasing circuit are not affected by switching activities of the switching current source circuit,
wherein the gate terminal of the third transistor is coupled to the switch device.

12. The charge pump of claim 11, wherein the switch device comprises
first and second transistors, the first transistor configured as a p-type metal oxide semiconductor field-effect transistor (MOSFET) and the second transistor configured as an n-type MOSFET.

13. The charge pump of claim 12, wherein the n-type MOSFET is configured with a gate terminal to receive the control signal while the p-type MOSFET is configured with a gate terminal to receive a complementary control signal.

14. The charge pump of claim 11, wherein the switch device couples to the bias node.

15. A phase-locked loop, comprising:
a phase detector configured to receive a reference signal and a divider output signal and output a control signal and a complementary control signal;
a charge pump comprising:
a biasing circuit configured to receive the control signal from the phase detector and output a current pulse train signal to an output node,
wherein the biasing circuit comprises a third transistor having gate, source, and drain terminals, a fourth transistor having gate, source, and drain terminals, and a first capacitor,
wherein the gate terminal of the fourth transistor receives the control signal, the drain terminal of the fourth transistor is coupled to the source terminal of the third transistor, the source terminal of the fourth transistor is coupled to a ground voltage, and the drain terminal of the third transistor is coupled to the output node;
a switching current source circuit configured to enable current to flow through and into a bias node and to mirror the current onto the biasing circuit; and
a switch device disposed between the biasing circuit and the switching current source circuit,
wherein the switch device isolates the biasing circuit and the switching current source circuit so that the bias node and the biasing circuit are not affected by switching activities of the switching current source circuit,
wherein the gate terminal of the third transistor is coupled to the switch device;
a low pass filter configured to receive the current pulse train signal and output a control voltage;
a voltage controlled oscillator configured to receive the control voltage and output a corresponding frequency signal; and
a frequency divider configured receive the corresponding frequency signal and output the divider output signal for feedback to the phase detector.

16. The phase-locked loop of claim 15, wherein the switch device comprises
first and second transistors, the first transistor configured as a p-type metal oxide semiconductor field-effect transistor (MOSFET) and the second transistor configured as an n-type MOSFET.

17. The phase-locked loop of claim 16, wherein the n-type MOSFET is configured with a gate terminal to receive the control signal while the p-type MOSFET is configured with a gate terminal to receive the complementary control signal.

* * * * *